(12) United States Patent
Shibuta

(10) Patent No.: US 8,456,609 B2
(45) Date of Patent: Jun. 4, 2013

(54) EXPOSURE APPARATUS AND DEVICE MANUFACTURING METHOD

(75) Inventor: Makoto Shibuta, Kumagaya (JP)

(73) Assignee: Nikon Corporation, Tokyo (JP)

( * ) Notice: Subject to any disclaimer, the term of this patent is extended or adjusted under 35 U.S.C. 154(b) by 949 days.

(21) Appl. No.: 12/289,321

(22) Filed: Oct. 24, 2008

(65) Prior Publication Data

US 2009/0066923 A1 Mar. 12, 2009

Related U.S. Application Data

(62) Division of application No. 11/665,273, filed as application No. PCT/JP2005/018803 on Oct. 12, 2005, now Pat. No. 7,456,929.

(30) Foreign Application Priority Data

Oct. 15, 2004 (JP) ................................. 2004-301639

(51) Int. Cl.
*G03B 27/42* (2006.01)
*G03B 27/52* (2006.01)

(52) U.S. Cl.
USPC ............................................. 355/53; 355/30

(58) Field of Classification Search
USPC ......................................... 355/30, 53, 72–76
See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| 5,610,683 | A | 3/1997 | Takahashi |
| 5,715,039 | A | 2/1998 | Fukuda et al. |
| 5,825,043 | A | 10/1998 | Suwa |
| 5,969,441 | A | 10/1999 | Loopstra et al. |
| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,665,054 | B2 * | 12/2003 | Inoue .............................. 355/77 |

(Continued)

FOREIGN PATENT DOCUMENTS

| DE | 221 563 A1 | 4/1985 |
| DE | 224 448 A1 | 7/1985 |

(Continued)

OTHER PUBLICATIONS

May 14, 2008 Office Action issued in U.S. Appl. No. 11/665,273.

(Continued)

*Primary Examiner* — Hung Henry Nguyen
(74) *Attorney, Agent, or Firm* — Oliff & Berridge, PLC

(57) ABSTRACT

An exposure apparatus which prevents damages due to leaked out liquid from expanding and can maintain exposure accuracy and measuring accuracy. The exposure apparatus includes a first stage which is movable relative to the projection optical system, a second stage which is movable relative to the projection optical system, and a liquid immersion system that is capable of forming a liquid immersion region of a liquid under the projection optical system. The first and second stages are moved in a state in which a first overhang portion provided at the first stage and a second overhang portion provided at the second stage are brought close to or in contact with each other, such that the liquid immersion region is moved from one of upper surfaces of the first and second overhang portions to the other of the upper surfaces of the first and second overhang portions.

39 Claims, 8 Drawing Sheets

U.S. PATENT DOCUMENTS

| | | | |
|---|---|---|---|
| 6,778,257 B2 | 8/2004 | Bleeker et al. | |
| 6,897,963 B1 | 5/2005 | Taniguchi et al. | |
| 7,199,858 B2 * | 4/2007 | Lof et al. | 355/30 |
| 7,321,419 B2 | 1/2008 | Ebihara | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0263809 A1 | 12/2004 | Nakano | |
| 2005/0094125 A1 | 5/2005 | Arai | |
| 2006/0007419 A1 | 1/2006 | Streefkerk et al. | |
| 2006/0082741 A1 | 4/2006 | Van Der Toorn et al. | |
| 2006/0132737 A1 | 6/2006 | Magome et al. | |
| 2006/0132740 A1 | 6/2006 | Ebihara | |
| 2006/0227308 A1 | 10/2006 | Brink et al. | |
| 2008/0043210 A1 | 2/2008 | Shibuta | |

FOREIGN PATENT DOCUMENTS

| | | |
|---|---|---|
| EP | 1 528 431 A2 | 5/2005 |
| EP | 1 571 698 A1 | 9/2005 |
| EP | 1 653 501 A1 | 5/2006 |
| EP | 1 713 113 A1 | 10/2006 |
| EP | 1 713 114 A1 | 10/2006 |
| JP | A-57-117238 | 7/1982 |
| JP | A 57-117238 | 7/1982 |
| JP | A 58-202448 | 11/1983 |
| JP | A 59-019912 | 2/1984 |
| JP | A 62-65326 | 3/1987 |
| JP | A 63-157419 | 6/1988 |
| JP | A 4-65603 | 3/1992 |
| JP | A-04-065603 | 3/1992 |
| JP | A 4-305915 | 10/1992 |
| JP | A 4-305917 | 10/1992 |
| JP | A 5-21314 | 1/1993 |
| JP | A 5-62877 | 3/1993 |
| JP | A 6-124873 | 5/1994 |
| JP | A 7-176468 | 7/1995 |
| JP | A 7-220990 | 8/1995 |
| JP | A 8-37149 | 2/1996 |
| JP | A-08-316125 | 11/1996 |
| JP | A 8-316125 | 11/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-16816 | 1/1999 |
| JP | A 11-176727 | 7/1999 |
| JP | A 2000-58436 | 2/2000 |
| JP | A 2000-505958 | 5/2000 |
| JP | A 2001-267239 | 9/2001 |
| JP | A 2002-14005 | 1/2002 |
| JP | A-2004-207711 | 7/2004 |
| JP | A 2005-236087 | 9/2005 |
| JP | A-2005-259789 | 9/2005 |
| JP | A 2005-259789 | 9/2005 |
| JP | A 2005-268700 | 9/2005 |
| JP | A-2005-268700 | 9/2005 |
| JP | A 2005-268742 | 9/2005 |
| WO | WO 99/49504 | 9/1999 |
| WO | WO 01/035168 | 5/2001 |
| WO | WO 2004/019128 A2 | 3/2004 |
| WO | WO 2004/055803 | 7/2004 |
| WO | WO 2004/090577 A2 | 10/2004 |
| WO | WO 2004/114380 A1 | 12/2004 |
| WO | WO 2005/010962 A1 | 2/2005 |
| WO | WO 2005/074014 A1 | 8/2005 |
| WO | WO 2005/076321 A1 | 8/2005 |
| WO | WO 2005/124835 A1 | 12/2005 |

OTHER PUBLICATIONS

Jul. 25, 2008 Notice of Allowance issued in U.S. Appl. No. 11/665,273.

Aug. 17, 2009 Search Report issued in European Patent Application No. 05793142.0.

May 21, 2008 Examination Report issued in Singapore Patent Application No. 200702792-3.

Dec. 17, 2010 Search and Examination Report issued in Singapore Patent Application No. 200906802-4.

Jan. 17, 2006 International Search Report issued in PCT Patent Application PCT/JP2005/018803 with Translation.

Jan. 17, 2006 Written Opinion issued in PCT Patent Application PCT/JP2005/018803 with Translation.

\* cited by examiner

EXPOSURE APPARATUS AND DEVICE MANUFACTURING METHOD

This is a Division of application Ser. No. 11/655,273, now U.S. Pat. No. 7,456,929, which is the U.S. National Stage of PCT/JP2005/018803 filed Oct. 12, 2005. The disclosure of each of the prior applications is hereby incorporated by reference herein in its entirety.

The present invention relates to an exposure apparatus that exposes a substrate via an optical system and to a device manufacturing method.

The present application claims priority to Japanese Patent Application No. 2004-301639, filed on Oct. 15, 2004, and its content is incorporated herein by reference.

BACKGROUND

In the photolithography process, which is one of the processes for manufacturing micro-devices such as semiconductor devices or liquid crystal display devices, an exposure apparatus that projects a pattern formed on a mask onto a photosensitive substrate is used. Such an exposure apparatus has a mask stage that supports a mask and a substrate stage that supports a substrate and, while successively moving the mask stage and the substrate stage, projects an image of the pattern of the mask onto the substrate via a projection optical system. By the way, some of such exposure apparatuses include two stages that are movable independently of each other on the image plane side of the projection optical system. Further, in manufacturing micro-devices, miniaturization of the pattern formed on a substrate is required in order to make such micro-devices high-density ones. To address this requirement, it is desired that the exposure apparatus have a still higher resolution. As a means for realizing such a still higher resolution, such a liquid immersion exposure apparatus as disclosed in the patent document 1, below, in which the space between the projection optical system and the substrate is filled with a liquid to form a liquid immersion region, and an exposure process on the substrate is performed via the liquid of the liquid immersion region.

Patent Document 1: International Publication WO 99/49504 pamphlet.

SUMMARY

When the liquid leaks out, the environment (humidity etc.) in which the exposure apparatus is placed changes due to the liquid having leaked out, and thus there occurs a possibility that the exposure accuracy and the measurement accuracy are adversely affected. Further, if the liquid having leaked out is left as it is, various devices constituting the exposure apparatus may, for example, break down or rust, spreading the damage.

The present invention has been made in consideration of such situations, and its object is to provide an exposure apparatus which prevents the damage due to the liquid having leaked out from spreading and by which the exposure accuracy and the measurement accuracy can be maintained and to provide a device manufacturing method.

In accordance with a first aspect of the present invention, there is provided an exposure apparatus that exposes a substrate via a projection optical system, comprising: a first stage and a second stage that are movable, on the image plane side of the projection optical system, independently of each other in a two-dimensional plane substantially parallel to the image plane, a driving mechanism that moves the first stage and the second stage together within a predetermined region including the position directly beneath the projection optical system with the first stage and the second stage being close to or in contact with each other, a liquid immersion mechanism that forms a liquid immersion region of a liquid on the upper surface of at least one of the stages of the first stage and the second stage, a controller that by moving the first stage and the second stage together, moves the liquid immersion region between the upper surface of the first stage and the upper surface of the second stage with the liquid being retained between the projection optical system and the upper surface of at least one of the stages, and a detecting device that detects the liquid having leaked from between the first stage and the second stage when moving the liquid immersion region from the upper surface of one of the stages of the first stage and the second stage to the upper surface of the other stage.

In accordance with the first aspect of the present invention, there is provided the detecting device that detects the liquid having leaked from between the first stage and the second stage when the liquid immersion region of the liquid has been moved between the upper surface of the first stage and the upper surface of the second stage, and thus when the detecting device has detected the liquid, an appropriate action to prevent the damage due to the liquid having leaked from spreading can be promptly taken. Thus, the good exposure accuracy and the good measurement accuracy can be maintained.

In accordance with a second aspect of the present invention, there is provided a device manufacturing method that uses an exposure apparatus (EX) of the above-described mode.

In accordance with the second aspect of the present invention, since the exposure process and the measurement process can be performed well, devices having a desired performance can be manufactured.

In accordance with the present invention, since the damage due to the liquid having leaked out can be prevented from spreading, the exposure accuracy and the measurement accuracy can be maintained.

DETAILED DESCRIPTION

Figure 1:
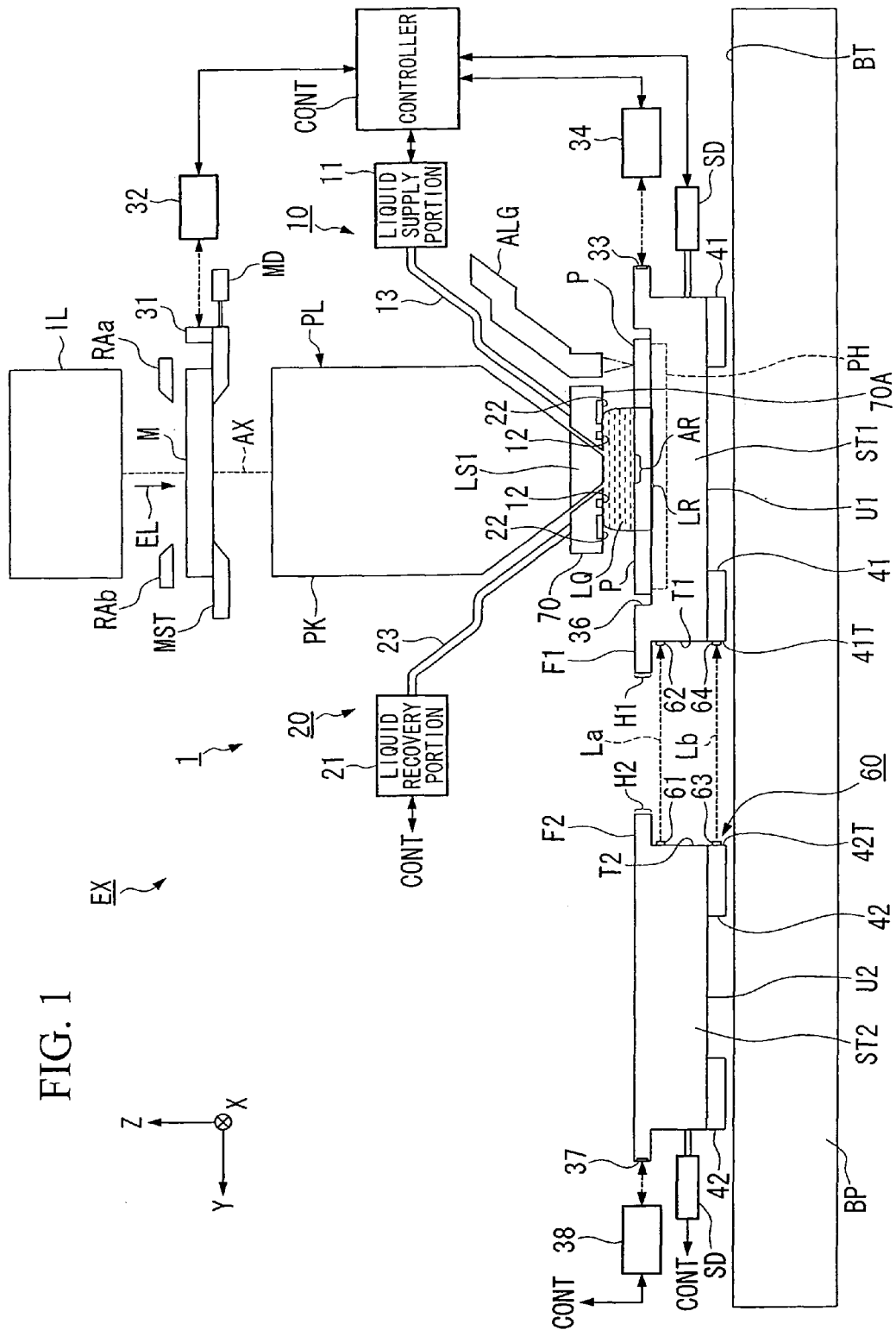
FIG. 1 is a schematic diagram showing an exposure apparatus in accordance with a first embodiment.

In the following, although embodiments of the present invention will be described referring to the drawings, the present invention is not limited to those embodiments.

First Embodiment

FIG. 1 is a schematic diagram showing an exposure apparatus in accordance with a first embodiment. In FIG. 1, exposure apparatus EX includes mask stage MST that is movable while holding mask M, with substrate stage ST1 that is movable while holding substrate P, with measurement stage ST2 that is movable while measuring devices related to the exposure process being mounted thereon, with illumination optical system IL that illuminates mask M held by mask stage MST with exposure light EL, with projection optical system PL that projects a pattern image of mask M illuminated with exposure light EL onto substrate P held by substrate stage ST1, and with controller CONT that controls the overall operation of exposure apparatus EX. Substrate stage ST1 and measurement stage ST2 are each movably supported on base member BP and are movable independently of each other. On undersurface U1 of substrate stage ST1 are provided gas bearings 41 for supporting substrate stage ST1 in a non-contact manner relative to upper surface BT of base member BP. Similarly, also on undersurface U2 of measurement stage ST2 are provided gas bearings 42 for supporting measurement stage ST2 in a non-contact manner relative to upper surface BT of base member BP. Substrate stage ST1 and measurement stage ST2 are movable respectively on the image plane side of the projection optical system PL, independently of each other in a two-dimensional plane (in the XY-plane) substantially parallel to the image plane.

Exposure apparatus EX of this embodiment is a liquid immersion exposure apparatus to which a liquid immersion method is applied, with the exposure wavelength being shortened in effect, to improve the resolution and, at the same time, to widen the depth of focus. Further, exposure apparatus EX includes liquid immersion mechanism 1 for forming liquid LQ's liquid immersion region LR on the image plane side of projection optical system PL. Liquid immersion mechanism 1 includes nozzle member 70 that is provided on the image plane side vicinity of projection optical system PL and has supply ports 12 for supplying liquid LQ and recovery ports 22 for recovering liquid LQ, with liquid supply mechanism 10 that supplies liquid LQ to the image plane side of projection optical system PL via supply ports 12 provided to nozzle member 70, and with liquid recovery mechanism 20 that recovers liquid LQ on the image plane side of projection optical system PL via recovery ports 22 provided to nozzle member 70. Nozzle member 70 is formed in a ring-shaped manner so as to surround the end portion of projection optical system PL on the image plane side. At least while transferring the pattern image of mask M onto substrate P, exposure apparatus EX locally forms, by liquid LQ having been supplied from liquid supply mechanism 10, liquid LQ's liquid immersion region LR that is larger than projection area AR of projection optical system PL and is smaller than substrate P on a portion of substrate P that includes projection area AR. More specifically, exposure apparatus EX adopts a local liquid immersion system in which the optical path space between first optical element LS1 located closest to the image plane of projection optical system PL and a portion of the surface of substrate P placed on the image plane side of projection optical system PL is filled with liquid LQ and by irradiating, via liquid LQ between projection optical system PL and substrate P and via projection optical system PL, exposure light EL having passed through mask M onto substrate P, projects the pattern of mask M onto substrate P to expose substrate P.

The embodiment will be described by assuming, as an example, a case where as exposure apparatus EX, a scan type exposure apparatus (the so-called scanning stepper) in which while synchronously moving mask M and substrate P in their respective scanning directions direction different from each other (diverse directions), the pattern formed on mask M is exposed onto substrate P is used. In the following description, it is assumed that the synchronous movement direction (scanning direction), in a horizontal plane, of mask M and substrate P is referred to as the X-axis direction, that the direction, in the horizontal plane, perpendicular to the X-axis direction is referred to as the Y-axis direction (non-scanning direction), and that the direction that is perpendicular to the X-axis direction and the Y-axis direction and coincides with optical axis AX of projection optical system PL is referred to as the Z-axis direction. Further, it is assumed that the direction around the X-axis, the direction around the Y-axis, and the direction around the Z-axis are respectively referred to as the θX-direction, the θY-direction, and the θZ-direction. It should be noted that a "substrate" referred to herein comprehends a base material, e.g., a semiconductor wafer, over which a photosensitive material (resist) is applied, and a "mask" comprehends a reticle on which a device pattern to be reduction-projected onto the substrate is formed.

By operating driving mechanism SD that includes linear motors etc., substrate stage ST1 and measurement stage ST2 are movable, respectively. By controlling driving mechanism SD, controller CONT can move substrate stage ST1 and measurement stage ST2 together, in the XY-plane, within a predetermined region including the position directly beneath projection optical system PL in a state that substrate stage ST1 and measurement stage ST2 are close to or in contact with each other. By moving substrate stage ST1 and measurement stage ST2 together, controller CONT can move liquid immersion region LR between upper surface F1 of substrate stage ST1 and upper surface F2 of measurement stage ST2 in a state that liquid LQ is retained between projection optical system PL and at least one of upper surface F1 of substrate stage ST1 and upper surface F2 of measurement stage ST2.

In the embodiment, on the upper portion of the side face of substrate stage ST1 is provided overhang portion H1 that protrudes outwardly from the center portion of upper surface F1 of substrate stage ST1. The upper surface of overhang portion H1 is also a portion of upper surface F1 of substrate stage ST1. Similarly, on the upper portion of the side face of measurement stage ST2 is provided overhang portion H2 that protrudes outwardly from the center portion of upper surface F2 of measurement stage ST2. The upper surface of overhang portion H2 is also a portion of upper surface F2 of measurement stage ST2. When, for example, liquid immersion region LR being moved from one of the stages to the other stage, the +Y side region of upper surface F1 of substrate stage ST1 and the −Y side region of upper surface F2 of measurement stage ST2 come close to or into contact with each other.

Here, the "state that substrate stage ST1 and measurement stage ST2 are close to each other" means a state in which, when liquid LQ between upper surface F1 of substrate stage ST1 and upper surface F2 of measurement stage ST2 being moved, substrate stage ST1 and measurement stage ST2 are close to each other to such a degree that liquid LQ does not leak out from between substrate stage ST1 and measurement stage ST2. The allowable value of the space between both stages ST1 and ST2 depends upon, e.g., the materials, surface treatments of both stages, the kind of liquid LQ or the like.

Further, exposure apparatus EX includes detecting device 60 that detects liquid LQ having leaked from between substrate stage ST1 and measurement stage ST2 when liquid immersion region LR from upper surface F1 (F2) of one of the stages of substrate stage ST1 and measurement stage ST2 to upper surface F2 (F1) of the other stage being moved. As described above, substrate stage ST1 and measurement stage ST2 are controlled such that their relative positional relationship is maintained so as to prevent liquid LQ from leaking, and they are moved together in a state that they are close to or in contact with each other. However, even if liquid LQ has leaked out, detecting device 60 is capable of detecting the liquid LQ having leaked.

Detecting device 60 includes light projecting portion 61 that emits detecting light La and with light receiving portion 62 that is disposed in a predetermined position relative to detecting light La. Light projecting portion 61 is provided on second side surface T2 of measurement stage ST2. On the other hand, light receiving portion 62 is provided on first side surface T1 of substrate stage ST1. First side surface T1 of substrate stage ST1 constitutes a region under overhang portion H1 and is a surface facing toward the +Y side. Further, second side surface T2 of measurement stage ST2 constitutes a region under overhang portion H2 and is a surface facing toward the −Y side. Thus, first side surface T1 of substrate stage ST1 and second side surface T2 of measurement stage ST2 face each other. Further, also on side face 42T of gas bearing 42, which supports measurement stage ST2 in a non-contact manner relative to base member BP, is provided light projecting portion 63 that emits detecting light Lb. On side face 41T of gas bearing 41, which supports substrate stage ST1 in a non-contact manner relative to base member BP, is provided light receiving portion 64 that corresponds to light projecting portion 63. Side face 41T of gas bearing 41 is a surface facing toward the +Y side; side face 42T of gas bearing 42 is a surface facing toward the −Y side; side face 41T of gas bearing 41 and side face 42T of gas bearing 42 face each other.

Substrate stage ST1 and measurement stage ST2 include overhang portion H1 and overhang portion H2, respectively. Thus, even when upper surface F1 of substrate stage ST1 and upper surface F2 of measurement stage ST2 are made close to or in contact with each other, second side surface T2, on which light projecting portion 61 is provided, and first side surface T1, on which light receiving portion 62 is provided, are mutually separated by a predetermined distance, and, at the same time, side face 42T, on which light projecting portion 63 is provided, and side face 41T, on which light receiving portion 64 is provided, are mutually separated by a predetermined distance. In other words, when upper surface F1 of substrate stage ST1 and upper surface F2 of measurement stage ST2 are made close to or in contact with each other, a space is formed under the portion where upper surface F1 and upper surface F2 are close to (or in contact with) each other.

It should be noted that it may, of course, be configured such that light projecting portion 61 is provided on substrate stage ST1, and light receiving portion 62 is provided on measurement stage ST2. Similarly, of course, it may also be configured such that light projecting portion 63 is provided on gas bearing 41, and light receiving portion 64 is provided on gas bearing 42.

Illumination optical system IL includes an exposure light source, an optical integrator for uniforming the illuminance of the light flux emitted from the exposure light source, a condenser lens for condensing exposure light EL from the optical integrator, a relay lens system, a field stop for setting an illumination area formed by exposure light EL on mask M, etc. A specified illumination area on mask M is illuminated, by illumination optical system IL, with exposure light EL having a uniform illuminance distribution. As exposure light EL emitted from illumination optical system IL, for example, a bright line (g-line, h-line, i-line) emitted from a mercury lamp, a deep ultraviolet light (DUV light) such as a KrF excimer laser light (wavelength of 248 nm), or a vacuum ultraviolet light (VUV light) such as an ArF excimer laser light (wavelength of 193 nm) or an $F_2$ excimer laser light (wavelength of 157 nm) may be used. In the embodiment, an ArF excimer laser light is used.

In the embodiment, purified or pure water is used as liquid LQ. Purified water can transmit not only an ArF excimer laser light however also, for example, a bright line (g-line, h-line, or i-line) emitted from a mercury lamp and a deep ultraviolet light (DUV light) such as a KrF excimer laser light (wavelength of 248 nm).

Mask stage MST is movable while holding mask M. Mask stage MST holds mask M by means of vacuum suction (or electrostatic suction). By operating driving mechanism MD which includes a linear motor etc. and is controlled by controller CONT, mask stage MST, in the state of holding mask M, is two-dimensionally movable in a plane perpendicular to optical axis AX of projection optical system PL, i.e., in the XY-plane, and is finely rotatable in the θZ-direction. On mask stage MST is set moving mirror 31. Further, laser interferometer 32 is positioned at a position facing moving mirror 31. The two-dimensional position and the rotation angle in the θZ-direction (including the rotation angles in the θX- and θY-directions in some cases) of mask M on mask stage MST are measured by laser interferometer 32 in real time. The measurement results from laser interferometer 32 are outputted to controller CONT. By operating driving mechanism MD based on the measurement results from laser interferometer 32, controller CONT performs the position control of mask M held by mask stage MST.

Projection optical system PL is for projecting the pattern image of mask M onto substrate P at a predetermined projection magnification of β and is constituted by a plurality of optical elements; these optical elements are held by lens barrel PK. In the embodiment, projection optical system PL is a reduction system of which projection magnification β is, e.g., ¼, ⅕, or ⅛. It should be noted that projection optical system PL may also be either a unit magnification system or a magnifying system. Among plurality of optical elements constituting projection optical system PL, first optical element LS1 located closest to the image plane of projection optical system PL protrudes from lens barrel PK.

Substrate stage ST1 has substrate holder PH which holds substrate P; substrate stage ST1 can move substrate holder PH in the image plane side of projection optical system PL. Substrate holder PH holds substrate P by means of, e.g., vacuum suction. On substrate stage ST1 is provided depression or recess portion 36, and substrate holder PH for holding substrate P is disposed in depression portion 36. Further, substrate stage ST1's upper surface F1 around depression portion 36 is made a flat surface (flat portion) so that it has a height substantially equal to that of (constitutes the same plane as) the surface of substrate P held by substrate holder PH.

By operating driving mechanism SD which includes linear motors etc. and is controlled by controller CONT, substrate stage ST1, in the state of holding substrate P via substrate holder PH, is two-dimensionally movable in the XY-plane substantially parallel to the image plane of projection optical system PL and is finely rotatable in the θZ-direction, on the image plane side of projection optical system PL. Further, substrate stage ST1 is also movable in the Z-axis-direction, in the θX-direction, and in the θY-direction. Thus, the upper surface of substrate P supported by substrate stage ST1 is movable in the six-degree-of-freedom directions, i.e., in the X-axis-direction, in the Y-axis-direction, in the Z-axis-direction, in the θX-direction, in the θY-direction, and in the θZ- direction. On the side face of substrate stage ST1 is provided moving mirror 33. Further, laser interferometer 34 is positioned at a position facing moving mirror 33. The two-dimensional position and the rotation angle of substrate P on substrate stage ST1 are measured by laser interferometer 34 in real time. In addition, exposure apparatus EX includes such an oblique-incidence type focus-leveling detection system (not shown) as disclosed in, e.g., Japanese Unexamined Patent Publication Hei 8-37149 that detects the surface position information of the surface of substrate P supported by substrate stage ST1. The focus-leveling detection system detects the surface position information of the surface of substrate P (position information in the Z-axis-direction and inclination information in the θX- and θY-directions of substrate P). It is to be noted that as the focus-leveling detection system, a system that uses an electric capacitance type sensor may be adopted. The measurement results from laser interferometer 34 are outputted to controller CONT. The detection results from the focus-leveling detection system are also outputted to controller CONT. By operating driving mechanism SD based on the detection results from the focus-leveling detection system, controller CONT controls the focus position (Z-position) and inclination angles (θX, θY) of substrate P to adjust the surface of substrate P to the image plane of projection optical system PL and, at the same time, performs, based on the measurement results from laser interferometer 34, the position control of substrate P in the X-axis-direction, in the Y-axis-direction, and in the OZ-direction.

Measurement stage ST2 is movable on the image plane side of projection optical system PL while various kinds of measuring devices (including members for measurement) that perform measurements related to the exposure process being mounted thereon. As those measuring devices, there can be listed such a fiducial mark plate on which a plurality of fiducial marks are formed as disclosed in, e.g., Japanese Unexamined Patent Publication Hei 5-21314, such a uniformity sensor for measuring the illumination intensity uniformity as disclosed in, e.g., Japanese Unexamined Patent Publication Sho 57-117238 or for measuring the variation amount of transmissivity of projection optical system PL for exposure light EL as disclosed in, e.g., Japanese Patent Application Publication No. 2001-267239, such an aerial image measuring sensor as disclosed in, e.g., Japanese Patent Application Publication No. 2002-14005, and such a dose sensor (illumination intensity sensor) as disclosed in Japanese Unexamined Patent Publication Hei 11-16816. Uppers surface F2 of measurement stage ST2 is made a flat surface (flat portion) so that it is substantially equal in height to (co-planer with) upper surface F1 of substrate stage ST1.

In the embodiment, corresponding to the performance of the liquid immersion exposure, in which substrate P is exposed with exposure light EL via projection optical system PL and liquid LQ, the above-mentioned uniformity sensor, aerial image measuring sensor, dose sensor, etc., which are used for measurements using exposure light EL, receive exposure light EL via projection optical system PL and liquid LQ. Further, with respect to each sensor, only a portion of, e.g., its optical system may be mounted on measurement stage ST2 or the entirety of the sensor may be disposed on measurement stage ST2.

By operating driving mechanism SD which includes linear motors etc. and is controlled by controller CONT, measurement stage ST2, in the state that the measuring devices are mounted thereon, is two-dimensionally movable in the XY-plane substantially parallel to the image plane of projection optical system PL and is finely rotatable in the θZ-direction, on the image plane side of projection optical system PL. Further, measurement stage ST2 is also movable in the Z-axis-direction, in the θX-direction, and in the θY-direction. In other words, as with substrate stage ST1, measurement stage ST2 is also movable in the six-degree-of-freedom directions, i.e., in the X-axis-direction, in the Y-axis-direction, in the Z-axis-direction, in the θX-direction, in the θY-direction, and in the θZ-direction. On the side face of measurement stage ST2 is provided moving mirror 37. Further, laser interferometer 38 is positioned at a position facing moving mirror 37. The two-dimensional position and the rotation angle of measurement stage ST2 are measured by laser interferometer 38 in real time.

It should be noted that while, in FIG. 1, moving mirror 33 and moving mirror 37 are respectively provided on overhang portion H1 of the stage ST1 and overhang portion H2 of the stage ST2, those moving mirrors may be respectively provided on the side face under the overhang portions. By doing so, even when liquid LQ leaks out from upper surface F1 or upper surface F2, overhang portion H1 or overhang portion H2 can prevent liquid LQ from adhering to moving mirror 33 or moving mirror 37.

In the vicinity of the end portion of projection optical system PL is provided an off-axis type alignment system ALG that detects an alignment mark on substrate P and fiducial mark on the fiducial mark plate. In the alignment system ALG of the embodiment, there is adopted such an FIA (Field Image Alignment) type system as disclosed in, e.g., Japanese Unexamined Patent Publication Hei 4-65603, in which a broad-band detecting light beam which does not expose the photosensitive material on substrate P is irradiated onto the target mark, the target marks' image imaged, by the reflected lights from the target mark, on the light receiving surface and the image of fiducial mark (fiducial mark pattern on a fiducial mark plate provided in alignment system ALG), not shown, are imaged by using an image pick-up device (e.g., a CCD), and then by applying an image processing on the image signals obtained, the marks' position is measured.

Further, in the vicinity of mask stage MST are provided a pair of mask alignment systems RAa and RAb, with those mask alignment systems being mutually separated in the Y-axis-direction by a predetermined distance, each of which constitutes a TTR type alignment system, using a light having the same wavelength as the exposure light, for simultaneously observing via projection optical system PL the alignment marks on mask M and the corresponding fiducial marks on the fiducial mark plate. In the mask alignment system of the embodiment, there is adopted such a VRA (Visual Reticle Alignment) system as disclosed in, e.g., Japanese Unexamined Patent Publication Hei 7-176468, in which a light is irradiated onto the marks, and by applying an image processing on the image data of the marks imaged by, e.g., a CCD, the marks' positions are detected.

Next, liquid supply mechanism 10 and liquid recovery mechanism 20 of liquid immersion mechanism 1 will be described. Liquid supply mechanism 10 is for supplying liquid LQ to the image plane side of projection optical system PL and includes liquid supply portion 11 capable of delivering liquid LQ and with supply pipe 13 of which one end portion is connected to liquid supply portion 11. The other end portion of supply pipe 13 is connected to nozzle member 70. Inside nozzle member 70 is formed an inner flow path (supply flow path) that connects the other end portion of supply pipe 13 to supply ports 12. Liquid supply portion 11 includes a tank that stores liquid LQ, a pressurizing pump, a filter unit that removes foreign particles in liquid LQ, etc. The liquid supply operation of liquid supply device 11 is controlled by controller CONT.

Liquid recovery mechanism 20 is for recovering liquid LQ from the image plane side of projection optical system PL and includes liquid recovery portion 21 capable of recovering liquid LQ and with recovery pipe 23 of which one end is connected to liquid recovery portion 21. The other end of recovery pipe 23 is connected to nozzle member 70. Inside nozzle member 70 is formed an inner flow path (recovery flow path) that connects the other end portion of recovery pipe 23 to recovery port 22. Liquid recovery portion 21 includes a vacuum system (suction device), e.g., a vacuum pump, a gas-liquid separator that separates the recovered liquid LQ from gas, a tank that stores the recovered liquid LQ, etc.

Supply ports 12 that supplies liquid LQ and recovery port 22 that recovers liquid LQ are formed on undersurface 70A of nozzle member 70. Undersurface 70A of nozzle member 70 is disposed in a position facing the surface of substrate P, upper surface F1 of the stage ST1, and upper surface F2 of the stage ST2. Nozzle member 70 is a ring-shaped member that is provided so as to surround the side face of first optical element LS1. A plurality of supply ports 12 are provided so as to surround, in undersurface 70A of nozzle member 70, first optical element LS1 of projection optical system PL (optical axis AX of projection optical system PL). Further, recovery port 22 is provided, in undersurface 70A of nozzle member 70, outside supply ports 12 relative to first optical element LS1 and thus is provided so as to surround first optical element LS1 and supply ports 12.

Finally, by supplying a predetermined amount of liquid LQ onto substrate P by using liquid supply mechanism 10 and by, at the same time, recovering a predetermined amount of liquid LQ on substrate P by using liquid recovery mechanism 20, controller CONT locally forms on substrate P liquid immersion region LR of liquid LQ. In forming liquid immersion region LR of liquid LQ, controller CONT operates each of liquid supply portion 11 and liquid recovery portion 21. When liquid LQ is delivered from liquid supply portion 11 under control of controller CONT, the liquid LQ delivered from liquid supply portion 11 is, after flowing through supply pipe 13, supplied, via the supply flow path of nozzle member 70, from supply ports 12 to the image plane side portion of projection optical system PL. Further, when liquid recovery portion 21 is driven under control of controller CONT, liquid LQ on the image plane side of projection optical system PL flows, via recovery port 22, into the recovery flow path of nozzle member 70 and, after flowing through recovery pipe 23, is recovered by liquid recovery portion 21.

Figure 2:
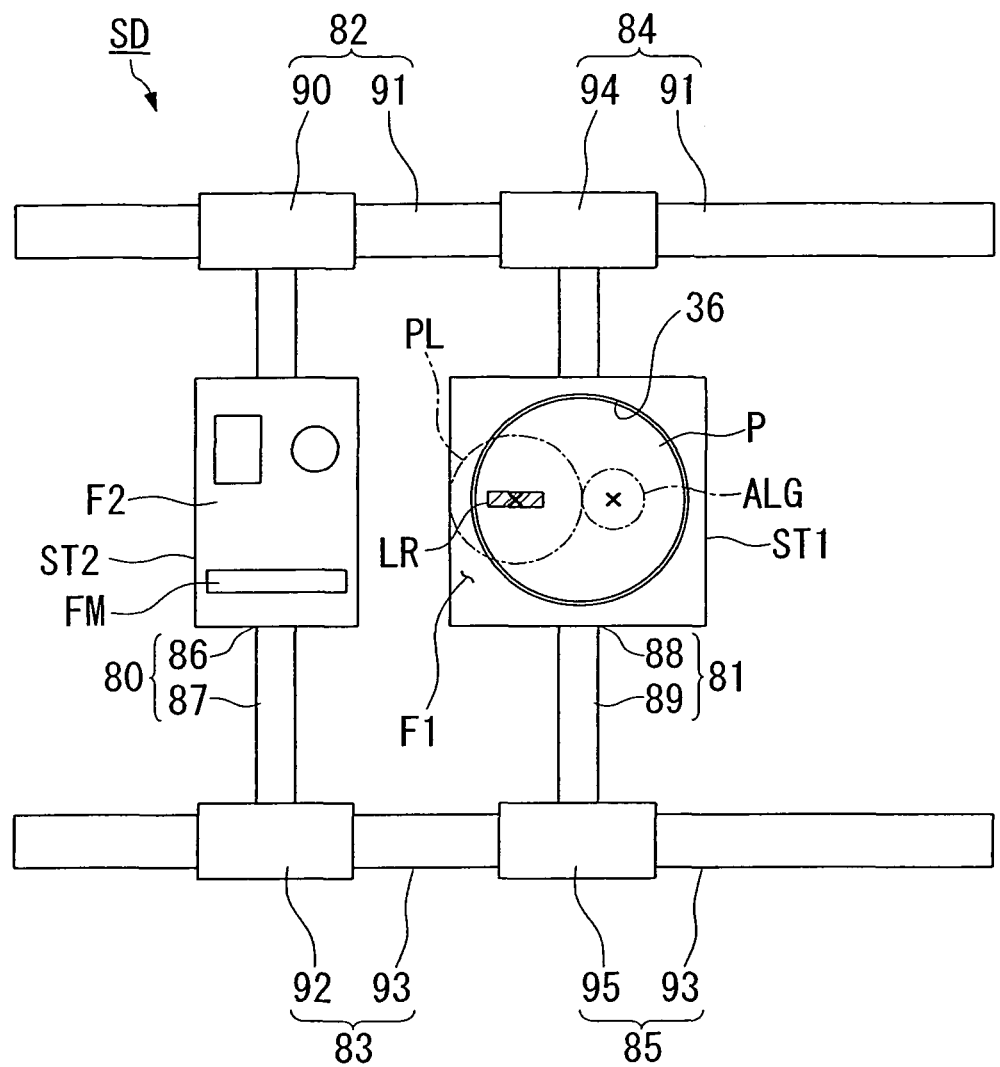
FIG. 2 is a plan view of a substrate stage and a measurement stage, as viewed from above.

FIG. 2 is a drawing of substrate stage ST1 and measurement stage ST2, as viewed from above. In FIG. 2, driving mechanism SD for driving substrate stage ST1 and measurement stage ST2 includes linear motors 80, 81, 82, 83, 84, and 85. Driving mechanism SD includes a pair of Y-axis linear guides 91 and 93 extending in the Y-axis-direction. Each of Y-axis linear guides 91 and 93 is disposed such that they are mutually separated, in the X-axis-direction, by a predetermined distance. Each of Y-axis linear guides 91 and 93 is constituted by a magnet unit in which a permanent magnet group constituted by multiple pairs of an N-pole magnet and an S-pole magnet disposed at predetermined intervals and alternately along, e.g., the Y-axis-direction is embedded. On Y-axis linear guide 91, which is one of the Y-axis linear guides, are supported two sliders 90 and 94 movably in the Y-axis-direction in a non-contact state. Similarly, on Y-axis linear guide 93, which is the other one of the Y-axis linear guides, are supported two sliders 92 and 95 movably in the Y-axis-direction in a non-contact state. Each of sliders 90, 92, 94, and 95 is constituted by a coil unit in which armature coils disposed at predetermined intervals along, e.g., the Y-axis-direction are embedded. In other words, in the embodiment, each of the moving coil type Y-axis linear motors 82 and 84 is constituted by slider 90 constituted by the coil unit and Y-axis linear guide 91 and by slider 94 constituted by the coil unit and Y-axis linear guide 91, respectively. Similarly, each of the moving coil type Y-axis linear motors 83 and 85 is constituted by slider 92 and Y-axis linear guide 93 and by slider 95 and Y-axis linear guide 93, respectively.

Slider 90 constituting Y-axis linear motor 82 and slider 92 constituting Y-axis linear motor 83 are respectively fixed to one end portion and the other end portion located in the longitudinal direction of X-axis linear guide 87 extending in the X-axis-direction. Further, slider 94 constituting Y-axis linear motor 84 and slider 95 constituting Y-axis linear motor 85 are respectively fixed to one end portion and the other end portion located in the longitudinal direction of X-axis linear guide 89 extending in the X-axis-direction. Thus, X-axis linear guide 87 can be moved in the Y-axis-direction by Y-axis linear motors 82 and 83; X-axis linear guide 89 can be moved in the Y-axis-direction by Y-axis linear motors 84 and 85.

Each of X-axis linear guides 87 and 89 is constituted by a coil unit in which armature coils disposed at predetermined intervals along, e.g., the X-axis-direction are embedded. X-axis linear guide 89 is provided, in an inserted state, to an opening portion formed in substrate stage ST1. Inside the opening portion of substrate stage ST1 is provided magnet unit 88 having a permanent magnet group constituted by multiple pairs of an N-pole magnet and an S-pole magnet disposed at predetermined intervals and alternately along, e.g., the X-axis-direction. A moving magnet type X-axis linear motor 81 that drives substrate stage ST1 in the X-axis-direction is constituted by magnet unit 88 and X-axis linear guide 89. Similarly, X-axis linear guide 87 is provided, in an inserted state, to an opening portion formed in measurement stage ST2. In the opening portion of measurement stage ST2 is provided magnet unit 86. A moving magnet type X-axis linear motor 80 that drives measurement stage ST2 in the X-axis-direction is constituted by magnet unit 86 and X-axis linear guide 87.

Further, by making the driving forces generated by the pair of Y-axis linear motors 84 and 85 (or 82 and 83) slightly different from each other, control in the θZ-direction of substrate stage ST1 (or measurement stage ST2) can be implemented. Further, in the drawing, each of substrate stage ST1 and measurement stage ST2 is illustrated as a single stage, however, actually, each of the stages includes an XY stage driven by the Y-axis linear motors and with a Z-tilt stage that is mounted over the XY stage via a Z-leveling driving mechanism (e.g., voice coil motors) and is finely moved relative to the XY stage in the Z-axis-direction, in the θX-direction, and in the θY-direction. Further, substrate holder PH (see FIG. 1), which holds substrate P, is supported by the Z-tilt stage.

In the following, referring to FIGS. 2-4B, there will be described parallel processing operations using substrate stage ST1 and measurement stage ST2.

As shown in FIG. 2, during a liquid immersion exposure of substrate P, controller CONT makes measurement stage ST2 wait at a predetermined waiting position where measurement stage ST2 does not collide with substrate stage ST1. Further, in the state that substrate stage ST1 and measurement stage ST2 are mutually separated, controller CONT performs a step-and-scan type liquid immersion exposure on substrate P supported by substrate stage ST1. When substrate P is subjected to a liquid immersion exposure, controller CONT forms liquid immersion region LR of liquid LQ on substrate stage ST1 by using liquid immersion mechanism 1.

Figure 3A:
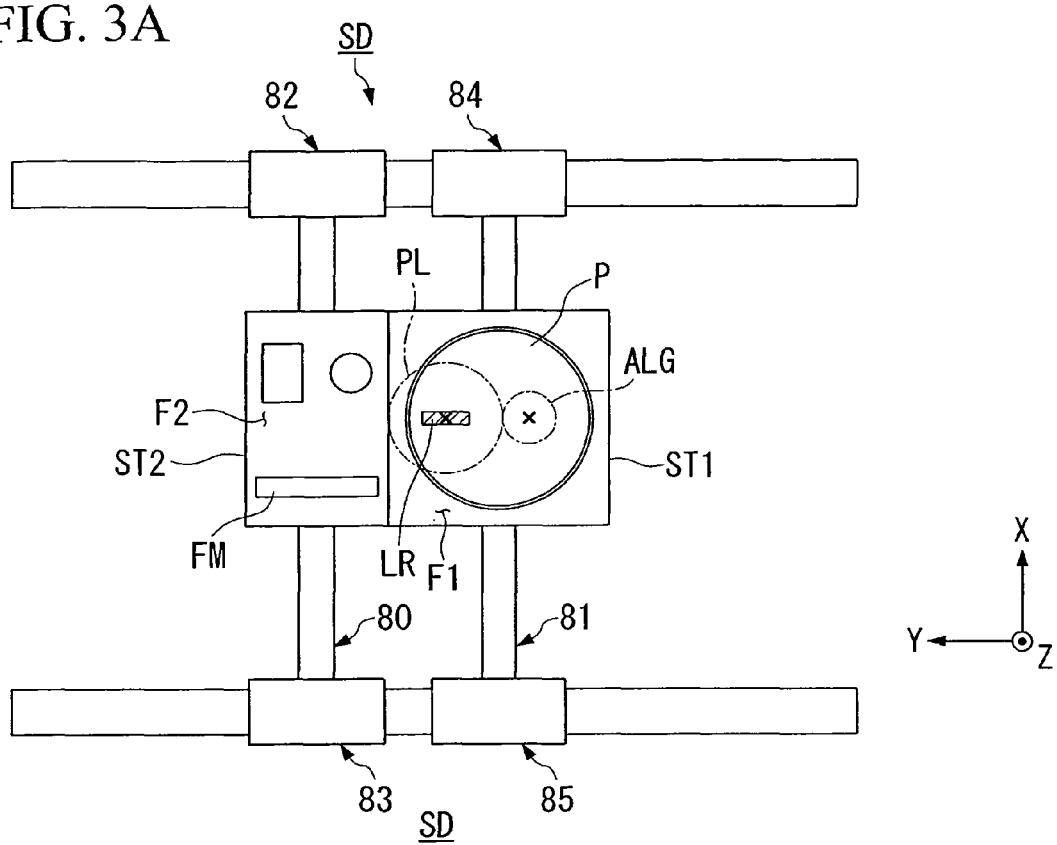
FIG. 3A is a drawing for illustrating the operations of the substrate stage and the measurement stage.

Upon completion of the liquid immersion exposure on substrate P in substrate stage ST1, controller CONT moves measurement stage ST2 by using driving mechanism SD to make measurement stage ST2 come into contact with or close to substrate stage ST1, as shown in FIG. 3A.

Next, while maintaining the relative positional relationship in the Y-axis-direction between substrate stage ST1 and measurement stage ST2, controller CONT moves substrate stage ST1 and measurement stage ST2 simultaneously in the −Y direction by using driving mechanism SD. More specifically, controller CONT moves substrate stage ST1 and measurement stage ST2 together in the −Y direction within a predetermined region including the position directly beneath projection optical system PL in a state that substrate stage ST1 and measurement stage ST2 are in contact with (or close to) each other.

Figure 3B:
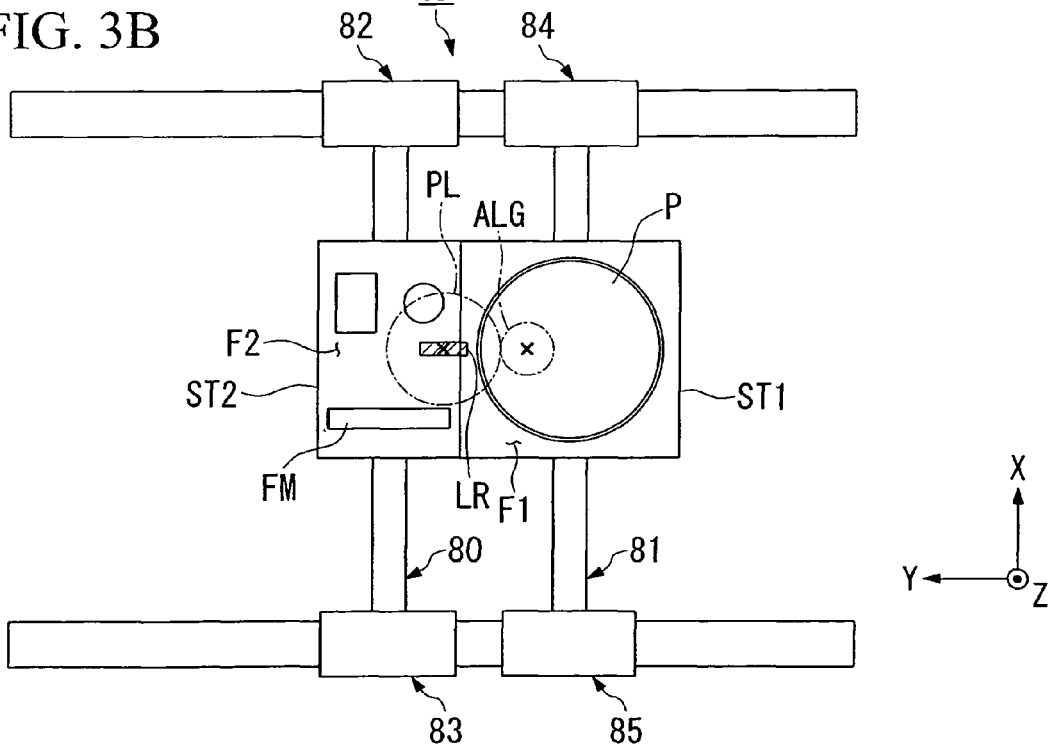
FIG. 3B is a drawing for illustrating the operations of the substrate stage and the measurement stage.

By moving substrate stage ST1 and measurement stage ST2 together, controller CONT moves liquid immersion region LR of liquid LQ retained between first optical element LS1 of projection optical system PL and substrate P, by way of upper surface F1 of substrate stage ST1, to upper surface F2 of measurement stage ST2. In accordance with the movement in the −Y direction of substrate stage ST1 and measurement stage ST2, liquid LQ's liquid immersion region LR that was formed between first optical element LS1 of projection optical system and substrate P moves to the surface of substrate P, to upper surface F1 of substrate stage ST1, and to upper surface F2 of measurement stage ST2, in this order. In this regard, along the way when liquid immersion region LR of liquid LQ moves from upper surface F1 of substrate stage ST1 to upper surface F2 of measurement stage ST2, liquid immersion region LR is disposed such that it straddles the boundary region between upper surface F1 of substrate stage ST1 and upper surface F2 of measurement stage ST2, as shown in FIG. 3B.

Figure 4A:
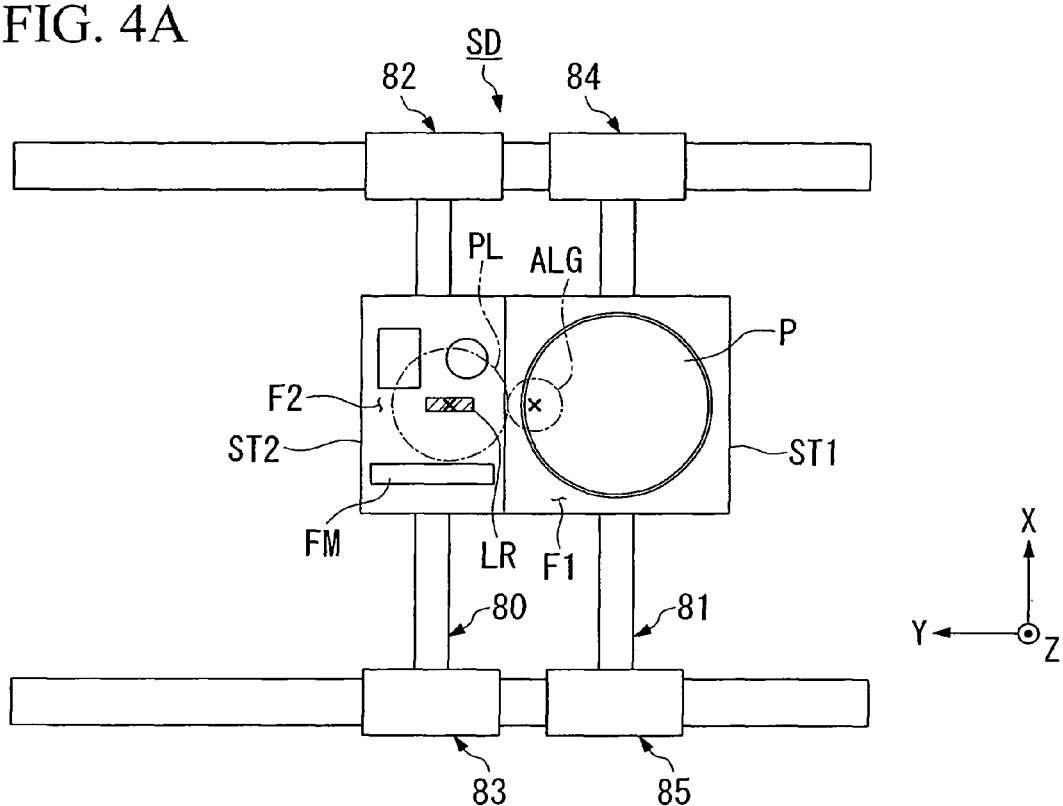
FIG. 4A is a drawing for illustrating the operations of the substrate stage and the measurement stage.

When, from the state of FIG. 3A, substrate stage ST1 and measurement stage ST2 further move together in the −Y direction by a predetermined distance, there occurs, as shown in FIG. 4A, the state in which liquid LQ is retained between first optical element LS1 of projection optical system PL and measurement stage ST2. In other words, liquid immersion region LR of LQ is disposed on upper surface F2 of measurement stage ST2.

Figure 4B:
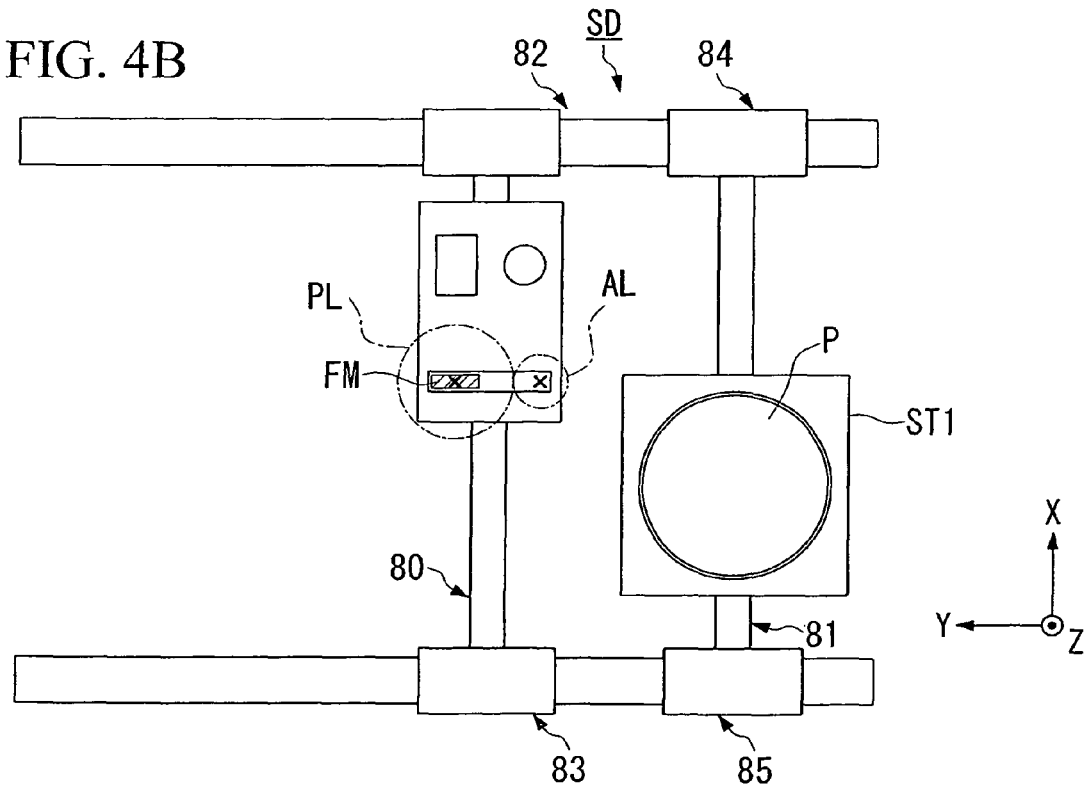
FIG. 4B is a drawing for illustrating the operations of the substrate stage and the measurement stage.

Next, controller CONT moves substrate stage ST1 to a predetermined substrate exchange position by using driving mechanism SD to exchange substrate P and, in parallel to this process, performs predetermined measurement processes using measurement stage ST2, as required. As an example of such measurement processes, there is the baseline measurement of alignment system ALG. Specifically, controller CONT simultaneously detects a pair of first fiducial marks on fiducial mark plate FM provided on measurement stage ST2 and mask alignment marks on mask M corresponding to the first fiducial marks by using the above-described mask alignment systems RAa and RAb and detects the positional relationship between the first fiducial marks and the mask alignment marks corresponding thereto. Further, by detecting a second fiducial mark on fiducial mark plate FM by use of alignment system ALG, controller CONT detects the positional relationship between the detection reference position of alignment system ALG and the second fiducial mark. Further, based upon the detected positional relationship between the above-described first fiducial marks and the mask alignment marks corresponding thereto, the detected positional relationship between the detection reference position of alignment system ALG and the second fiducial mark, and a known positional relationship between the first fiducial marks and the second fiducial mark, controller CONT determines the distance between the projection center of the mask pattern formed by projection optical system PL and the detection reference position of alignment system ALG, i.e., the baseline of alignment system ALG FIG. 4B shows the state at this time.

Further, upon completion of the above-described processes on both stages ST1 and ST2, controller CONT, for example, makes measurement stage ST2 and substrate stage ST1 come into contact with (or close to) each other and then moves the stages in the XY-plane in the state that their relative positional relationship is maintained to perform alignment processes on the exchanged substrate P. In this regard, a plurality of shot areas are set on substrate P. Alignment marks associated with each of the plurality of shot areas are provided. Controller CONT detects the alignment marks on the exchanged substrate P by using alignment system ALG and calculates the position coordinates of each of the plurality of shot areas set on substrate P relative to the detection reference position of alignment system ALG.

Thereafter, in reverse to the former process, by moving substrate stage ST1 and measurement stage ST2 together in the +Y direction while maintaining the relative positional relationship in the Y-axis-direction between both stages ST1 and ST2, controller CONT moves substrate stage ST1 (substrate P) under projection optical system PL and then moves measurement stage ST2 to a predetermined position. By this, liquid immersion region LR is disposed on upper surface F1 of substrate stage ST1. Also along the way when liquid immersion region LR of liquid LQ is moved from upper surface F2 of measurement stage ST2 to upper surface F1 of substrate stage ST1, liquid immersion region LR is disposed such that it straddles the boundary region between upper surface F1 of substrate stage ST1 and upper surface F2 of measurement stage ST2.

Thereafter, controller CONT performs a step-and-scan type liquid immersion exposure process on substrate P to sequentially transfer the pattern of mask M onto each of the plurality of shot areas on substrate P. It is to be noted that the movement (position) of substrate stage ST1 for the purpose of exposing each shot area on substrate P is controlled based upon the position coordinates of the plurality of shot areas on substrate P obtained through the above-described substrate alignment and upon the baseline measured just before.

It is to be noted that the measurement operation should not be limited to the above-described baseline measurement; it may also be configured such that an illumination intensity measurement, an illumination intensity uniformity measurement, an aerial image measurement, etc. are performed in parallel to, e.g., the substrate exchange process, by using measurement stage ST2, and such measurements are reflected in the exposure of substrate P performed thereafter, by performing, e.g., a calibration process of projection optical system PL based upon the measurement results from such measurements.

Further, in the above-described description, the alignment process on the exchanged substrate P is performed in the state that substrate stage ST1 and measurement stage ST2 are in contact with (or close to) each other, however it may also be configured such that upon completion of the alignment process on exchanged substrate P, substrate stage ST1 and measurement stage ST2 are made to come into contact with (close to) each other to move liquid immersion region LR.

Since, in the embodiment, liquid immersion region LR of liquid LQ can be moved between upper surface F1 of substrate stage ST1 and upper surface F2 of measurement stage ST2 without performing such processes as full recovery of liquid LQ and re-supply of liquid LQ, the time between the completion of the exposure operation in substrate stage ST1 and the beginning of the measurement operation in measurement stage ST2 and the time between the measurement completion in measurement stage ST2 and the beginning of the exposure operation in substrate stage ST1 are shortened, and thus the throughput can be improved. Further, since liquid LQ always exists on the image plane side of projection optical system PL, generation of an adhesion trace (so-called water mark) can be effectively prevented.

As described above, along the way when liquid immersion region LR of liquid LQ is moved from upper surface F1 of substrate stage ST1 to upper surface F2 of measurement stage ST2 or along the way when the liquid is moved from upper surface F2 of measurement stage ST2 to upper surface F1 of substrate stage ST1, there arises the state that liquid immersion region LR is disposed such that it straddles the boundary region between upper surface F1 of substrate stage ST1 and upper surface F2 of measurement stage ST2.

Figure 5:
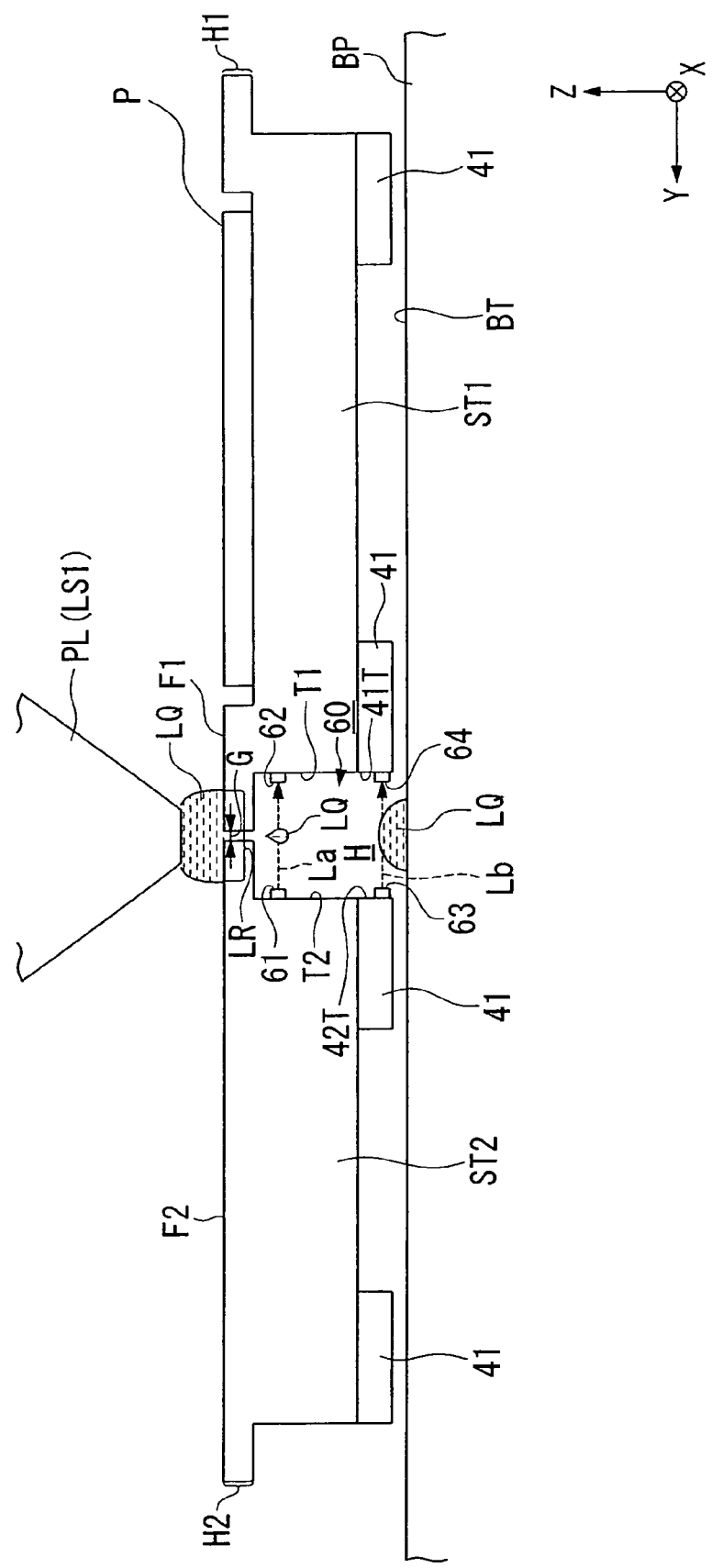
FIG. 5 is a drawing for illustrating a condition in which a detecting device is detecting a liquid.

FIG. 5 is a drawing showing the state in which liquid immersion region LR straddles the boundary region between upper surface F1 of substrate stage ST1 and upper surface F2 of measurement stage ST2. In this state, liquid LQ of liquid immersion region LR may leak from between substrate stage ST1 and measurement stage ST2. When liquid LQ leaks from gap G between upper surface F1 of substrate stage ST1 and upper surface F2 of measurement stage ST2, the liquid LQ having leaked drops from the upper surfaces F1 and F2 by the action of gravitation. Detecting device 60 detects in a non-contact manner the liquid LQ having leaked.

Substrate stage ST1 and measurement stage ST2 have overhang portion H1 and overhang portion H2, respectively. Thus, even when upper surface F1 of substrate stage ST1 and upper surface F2 of measurement stage ST2 are made to come close to or into contact with each other, it is configured such that space H is formed under the portion where upper surface F1 and upper surface F2 are close to or in contact with each other, i.e., under gap G. Thus, liquid LQ having leaked from gap G drops, after passing through space H, onto base member BP. Further, even when upper surface F1 of substrate stage ST1 and upper surface F2 of measurement stage ST2 are made to come close to or into contact with each other, the optical path spaces of detecting light La and detecting light Lb are secured by space H. Here, detecting light La emitted from light projecting portion 61 and detecting light Lb emitted from light projecting portion 63 proceed substantially in parallel to the XY-plane. In particular, detecting light Lb emitted from light projecting portion 63 proceeds, in the vicinity of base member BP, substantially in parallel to upper surface BT of base member BP.

Based on the light reception results from light receiving portion 62, detecting device 60 detects whether there is liquid LQ in space H. More specifically, based on light reception results from light receiving portion 62, detecting device 60 can detects liquid LQ that leaks from gap G, drops, and passes through space H. Further, based on light reception results from light receiving portion 64, detecting device 60 can detect whether there is liquid LQ on upper surface BT of base member BP.

Light projecting portion 61 and light receiving portion 62 face each other; detecting light La emitted from light projecting portion 61 reaches light receiving portion 62; and it is configured such that detecting light La is received by light receiving portion 62 at a predetermined level of light amount (light intensity). In this regard, when, as shown in, e.g., FIG. 5, liquid LQ having leaked from gap G drops and passes through the optical path of detecting light La, detecting light La is refracted, scattered, or absorbed by liquid LQ. Accordingly, when there is liquid LQ on the optical path of detecting light La, the light amount (light intensity) received by light receiving portion 62 decreases, or detecting light La does not reach light receiving portion 62. Thus, based on the light reception results (light-reception amount) from light receiving portion 62, detecting device 60 can detect whether there is liquid LQ on the optical path of detecting light La. And thus, by detecting whether there is liquid LQ on the optical path of detecting light La, detecting device 60 can detect whether liquid LQ has leaked from gap G.

Similarly, light projecting portion 63 and light receiving portion 64 face each other; detecting light Lb emitted from light projecting portion 63 reaches light receiving portion 64; and it is configured such that detecting light Lb is received by light receiving portion 64 at a predetermined level of light amount (light intensity). In this regard, if, as shown in FIG. 5, when liquid LQ having leaked is disposed on upper surface BT of base member BP, detecting light Lb illuminates liquid LQ, then detecting light Lb is refracted, scattered, or absorbed by liquid LQ. Accordingly, based on the light reception results (light-reception amount) from light receiving portion 64, detecting device 60 can detect whether there is liquid LQ on the optical-path of detecting light Lb and thus can detect whether there is liquid LQ on upper surface BT of base member BP.

Each of detecting lights La and detecting lights Lb proceeds side by side along the X-axis-direction. Thus, detecting device 60 can detect leakage of liquid LQ over a wide range of space H and base member BP. Further, when controller CONT judges based on the detection results from detecting device 60 that liquid LQ has leaked, controller CONT, for example, decreases the per-unit-time liquid supply amount by liquid supply mechanism 10 or stops supplying liquid LQ by liquid supply mechanism 10. Alternatively, based on the detection results from detecting device 60, controller CONT increases the per-unit-time liquid recovery amount by liquid recovery mechanism 20. Alternatively, based on the detection results from detecting device 60, controller CONT stops the exposure operation on substrate P or the movement of the stages ST1 and ST2. In this way, when leakage of liquid LQ is detected, controller CONT can, by taking an appropriate action, prevent liquid LQ from flowing out onto, e.g., the floor on which exposure apparatus EX, spreading the damage. Additionally, gas bearings 41 and 42 provide with gas suction ports. When there is liquid LQ on base member BP, liquid LQ may flow into the gas suction ports of gas bearings 41 and 42. Thus, when controller CONT judges based on the light reception results from light receiving portion 64 that there is liquid LQ on base member BP, controller CONT may stop the sucking operation through gas suction ports of gas bearings 41 and 42. Further, by setting the optical path of detecting light Lb to be located near gas bearings 41 and 42, liquid LQ can be detected by using detecting light Lb before liquid LQ on base member BP flows into gas suction ports of gas bearings 41 and 42; thus, by taking an appropriate action depending on the detection results, it can be precluded that liquid LQ having flowed out onto base member BP flows into gas suction ports of gas bearings 41 and 42. Further, when liquid LQ penetrates between the undersurfaces (bearing surfaces) of gas bearings 41 and 42 and upper surface BT of base member BP, the Z-direction positions of the stages ST1 and ST2 may vary due to the liquid LQ. However, an appropriate action can be taken based on the detection results from detecting device 60. Further, when controller CONT judges based on the detection results from detecting device 60 that liquid LQ has leaked, controller CONT may raise an alarm by operating an alarm device, not shown. Since, by this, an operator, for example, can recognize that liquid LQ has leaked, he or she can take an appropriate action. The alarm device may raise an alarm by using a warning light, a warning sound, a display, or the like.

Since, in the embodiment, it is configured such that detecting device 60 optically detects liquid LQ in a non-contact manner, there is no need to dispose wirings or various kinds of devices in the vicinity of, e.g., base member BP or driving mechanism SD. Thus, the amount of influence on the movements of the stages ST1 and ST2 can be reduced.

Second Embodiment

Figure 6:
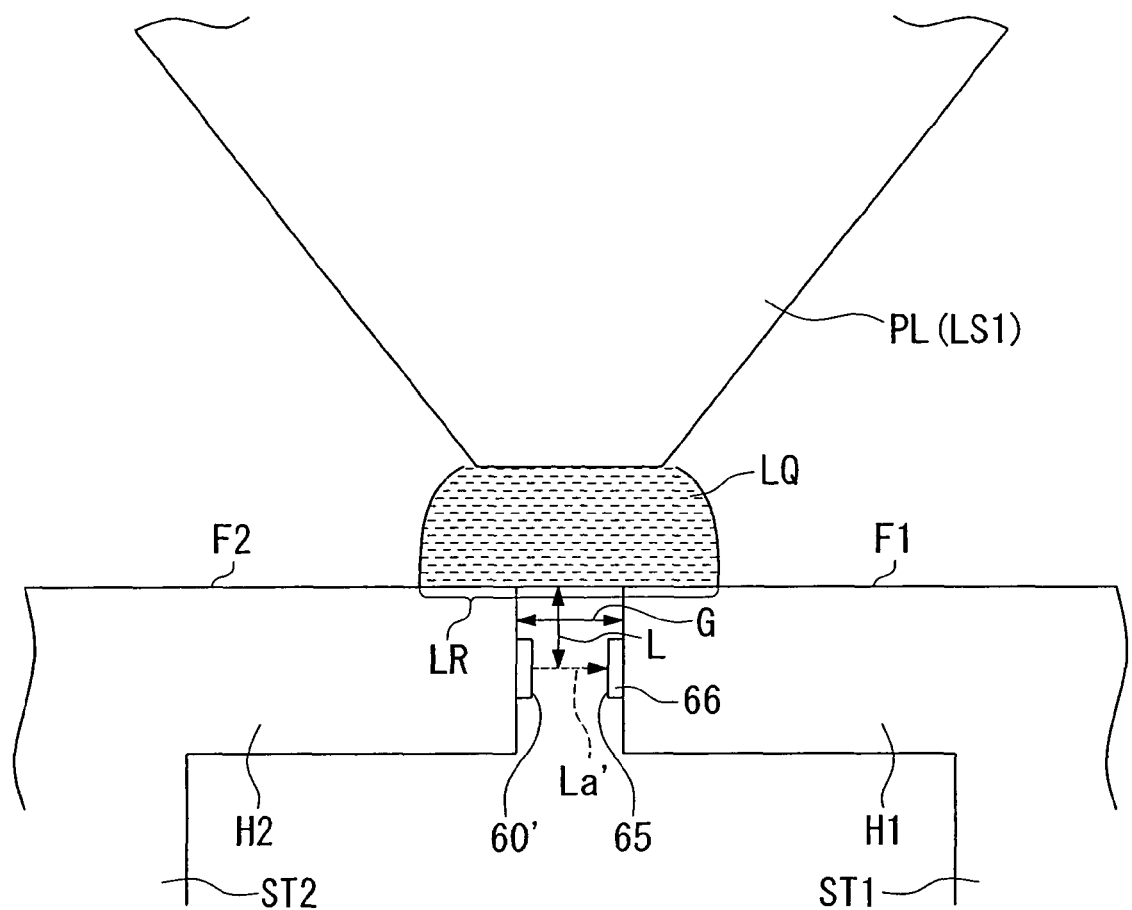
FIG. 6 is an enlarged view of a main portion of an exposure apparatus in accordance with a second embodiment.

FIG. 6 is a drawing showing a second embodiment. In the following description, with respect to the same or equivalent constituent elements as those in the above-described embodiment, their descriptions will be abridged or omitted. Detecting device 60' shown in FIG. 6 has both of a function of a light projecting portion emitting detecting light La' and a function of a light receiving portion receiving the light. Detecting device 60' is provided on overhang portion H2 of measurement stage ST2. On the other hand, reflecting member 66 having reflecting surface 65 is provided on a position that is located on overhang portion H1 of substrate stage ST1 and faces detecting device 60'. Detecting device 60' illuminates reflecting surface 65 with detecting light La, receives, at the same time, the reflected light from reflecting surface 65, and detects, based upon the light reception results, whether liquid LQ has leaked from gap G. When liquid LQ does not exist on the optical path of detecting light La', the reflected light of detecting light La' emitted from detecting device 60' is received by detecting device 60' at a predetermined level of light intensity. In contrast, since when liquid LQ exists on the optical path of detecting light La', detecting light La' is scattered or absorbed by liquid LQ, the reflected light thereof is received by detecting device 60' at a level of light intensity lower than the above-mentioned predetermined level of light intensity. Based upon the light reception results of the reflected light, detecting device 60' can detect whether there is liquid LQ on the optical path of detecting light La' and, thus, whether liquid LQ has leaked. With reflecting surface 65 being provided, the received light intensity difference between the case when liquid LQ exists on the optical path of detecting light La' and the case when liquid LQ does not exist thereon becomes large; thus, detecting device 60' can detect with high accuracy whether there is liquid LQ on the optical path of detecting light La'.

In addition, in this embodiment, the optical path of detecting light La' emitted from detecting device 60' exists within gap G between upper surface F1 and upper surface F2. By adopting such configuration, liquid LQ having leaked into gap G can be immediately detected by using detecting light La'.

It should be noted that it may also be configured such that detecting device 60' having both functions of a light projecting portion and a light receiving portion is provided on first side surface T1 (second side surface T2) that has been described referring to FIG. 5, and reflecting member 66 is provided on second side surface T2 (first side surface T1). Similarly, it may also be configured such that detecting device 60' is provided on gas bearing 41 (gas bearing 42) that has been described referring to FIG. 5, and reflecting member 66 is provided on gas bearing 42 (gas bearing 41). Conversely, it may also be configured such that light projecting portion 61 that has been described referring to FIG. 5 is provided on overhang portion H1 (or H2), and light receiving portion 62 is provided on overhang portion H2 (or H1).

Third Embodiment

Figure 7:
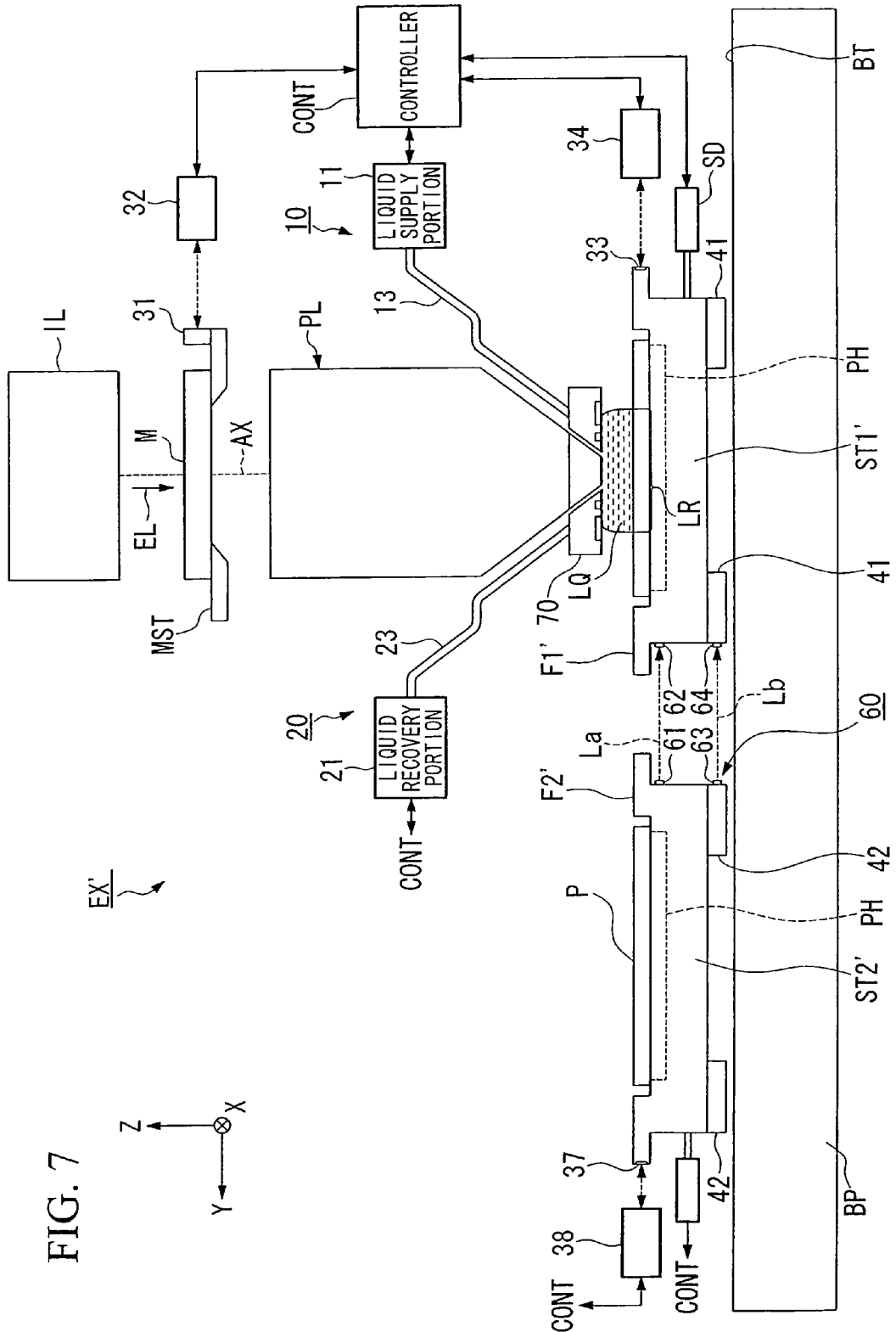
FIG. 7 is a schematic diagram showing an exposure apparatus in accordance with a third embodiment.

FIG. 7 is a drawing exposure apparatus EX' in accordance with a third embodiment. Exposure apparatus EX' shown in FIG. 7 is such a so-called twin-stage type exposure apparatus as disclosed in, e.g., Japanese Unexamined Patent Publication Hei 10-163099, Japanese Unexamined Patent Publication Hei 10-214783, and Published Japanese Translation 2000-505958, in which two substrate stages ST1' and ST2' that are movable while holding a substrate are provided. Also in exposure apparatus EX' shown in FIG. 7, liquid immersion region LR can be moved between upper surface F1' of first substrate stage ST1' and upper surface F2' of second substrate stage ST2'. Further, by providing detecting device 60 (60') as in the case of the above-described embodiments, liquid LQ having leaked from between first substrate stage ST1' and second substrate stage ST2' when moving liquid immersion region LR from the surface of one of the stages of first substrate stage ST1' and second substrate stage ST2' to the upper surface of the other stage can be detected.

As described above, in the embodiments, liquid LQ is purified water. Purified water has the advantage that it is easily available in bulk in, e.g., semiconductor manufacturing factories and also the advantage that it does not adversely affect photoresist on substrate P, optical elements (lenses), etc. Further, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory, it may be configured such that the exposure apparatus itself has an ultrapure water system.

The refractive index n of purified water (water) relative to exposure light EL having a wavelength of about 193 m is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

It should be noted that while, in the embodiments, liquid LQ is water (purified water), liquid LQ may be a liquid other than water. For example, when the light source of exposure light EL is an $F_2$ laser, the $F_2$ laser light does not transmit through water, and thus, as liquid LQ, a fluorofluid that can transmit the $F_2$ laser light, such as perfluoropolyether (PFPE) or fluorochemical oil, may be used. In this case, the portions that come into contact with liquid LQ are applied with lyophilic treatment, by forming a thin film of a substance which includes, e.g., fluorine and has a molecular structure of a small polarity. Further, as liquid LQ, a material (e.g., cedar oil) that can transmit exposure light EL, has a high refractive index as high as practicable, and does not affect projection optical system PL and the photoresist applied to the surface of substrate P can also be used. Also in this case, the surface treatment is applied in accordance with the polarity of liquid LQ to be used.

Further, while the exposure apparatus, to which the above-described immersion liquid method is applied, is configured such that with the optical path space on the exit side of first optical element LS1 of projection optical system PL being filled with a liquid (purified water), substrate P is exposed, the optical path space on the incidence side of first optical element LS1 of projection optical system PL may also be filled with the liquid (purified water), as disclosed in the International Publication WO 2004/019128.

It is to be noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used.

Further, regarding exposure apparatus EX, the present invention can be applied to an exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element). In this case, the present invention can be applied to a stitch type one-shot exposure apparatus in which thereafter, in the state that a second pattern and substrate P are substantially stationary, the reduction image of the second pattern is exposed at one time onto substrate P by using the projection optical system in a manner that the first pattern image and the second pattern image partially overlap with each other. Further, in conjunction with the stitch type exposure apparatus, the present invention can also be applied to a step-and-stitch type exposure apparatus in which at least two patterns are transferred onto substrate P in a partially overlapping manner, and substrate P is successively moved.

In the above-described embodiments, a light transmission type mask on which a predetermined light-shielding pattern (or a phase pattern/light decreasing pattern) is formed on a light transmissive substrate is used, however, instead of such mask, an electronic mask that forms, based upon the electronic data of a pattern to be exposed, a transmission pattern, a reflection pattern, or a light emitting pattern may also be used, as disclosed in, e.g., U.S. Pat. No. 6,778,257.

Further, the present invention can be applied also to an exposure apparatus (lithography system) in which by forming interference fringes on substrate P, a line-and-space pattern is exposed onto substrate P, as disclosed in the International Publication WO 2001/035168 pamphlet.

Further, while, in the above-described embodiments, the exposure apparatus, in which the liquid locally fills the space between projection optical system PL and substrate P, is adopted, the present invention can also be applied to a liquid immersion exposure apparatus in which the entire surface of a substrate to be exposed is covered by a liquid. The structure and exposure operation of an exposure apparatus in which the entire surface of a substrate to be exposed is covered by a liquid are described in, e.g., Japanese Unexamined Patent Publication Hei 6-124873, Japanese Unexamined Patent Publication Hei 10-303114, or U.S. Pat. No. 5,825,043.

Regarding the type of exposure apparatus EX, the present invention is not limited to an exposure apparatus, which exposes a semiconductor pattern onto substrate P, for manufacturing semiconductor devices, however can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices (CCDs), and an exposure apparatus for manufacturing reticles or masks.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

Figure 8:
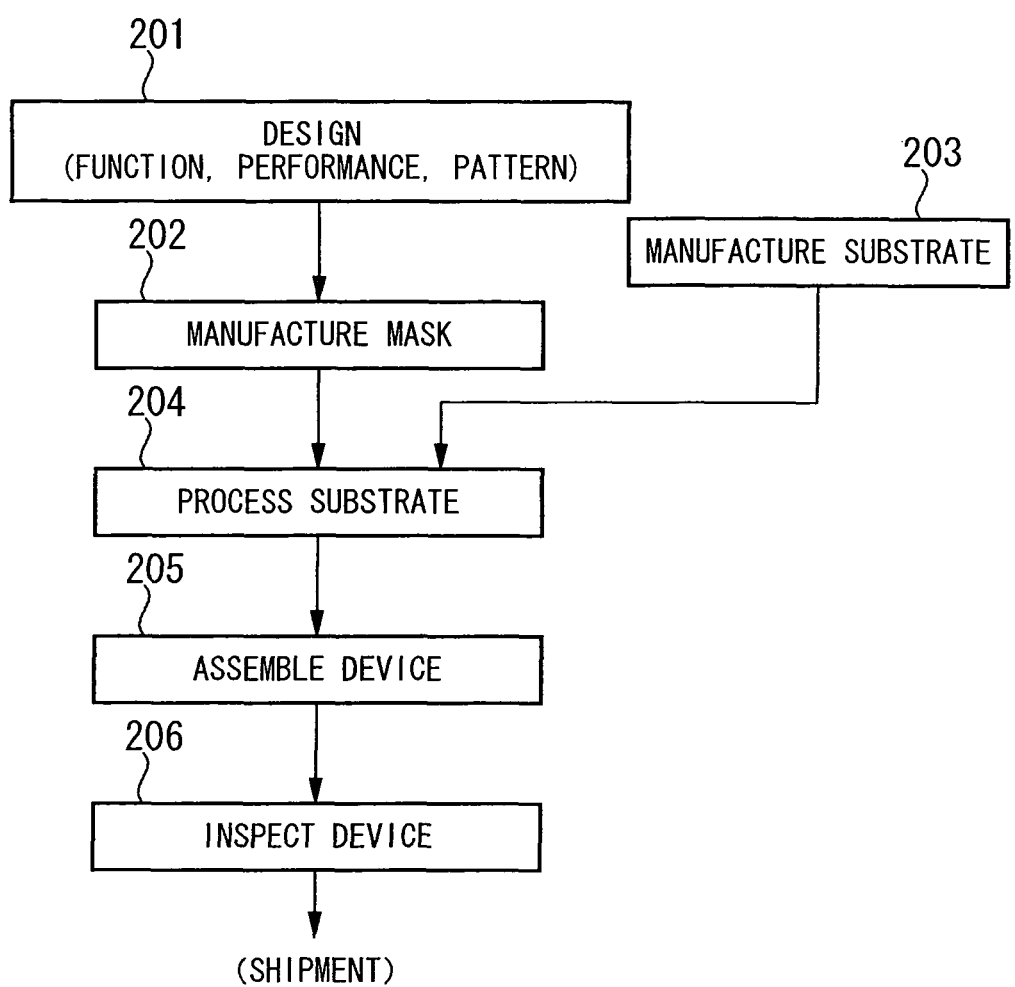
FIG. 8 is a flowchart showing an example of a micro-device manufacturing process.

As shown in FIG. 8, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate processing step 204 including a process in which the mask pattern is exposed onto the substrate by exposure apparatus EX according to the above-described embodiments; device assembly step 205 (including a dicing process, a bonding process, and a packaging process); inspection step 206.

The invention clamed is:

1. An exposure apparatus in which a substrate is exposed via a projection optical system, the apparatus comprising:
 a first stage which is movable relative to the projection optical system;
 a second stage which is movable relative to the projection optical system; and
 a liquid immersion system that forms a liquid immersion region of a liquid under the projection optical system,
 wherein the first and second stages are moved in a state in which a first overhang portion provided at the first stage and a second overhang portion provided at the second stage are brought close to or in contact with each other, such that the liquid of the liquid immersion region does not leak out from between the first and second stages while the liquid immersion region is moved from one of upper surfaces of the first and second overhang portions to the other of the upper surfaces of the first and second overhang portions.

2. The exposure apparatus of claim 1, wherein an area of the liquid immersion region is smaller than an area of a substrate held on one of the first and second stages.

3. The exposure apparatus of claim 1, wherein the first stage includes a substrate holder that holds a substrate.

4. The exposure apparatus of claim 3, wherein the second stage includes a substrate holder that holds a substrate.

5. The exposure apparatus of claim 1, wherein the upper surface of the first overhang portion and the upper surface of the second overhang portion are in a same plane when the liquid immersion region is moved from the one of the upper surfaces to the other of the upper surfaces.

6. The exposure apparatus of claim 1, wherein the first overhang portion extends along only one side of the first stage, and the second overhang portion extends along only one side of the second stage.

7. The exposure apparatus of claim 1, wherein the liquid immersion system surrounds a final optical element of the projection optical system and includes a liquid supply port by which the liquid is supplied to the liquid immersion region, and a liquid recovery port by which the liquid is recovered from the liquid immersion region.

8. An immersion exposure apparatus comprising:
a projection optical system having a final optical element by which an image of a pattern is projected onto a substrate;
a first stage which is movable relative to the projection optical system, the first stage having a substrate holder on which the substrate is held and having a first overhang portion on one side;
a second stage which is movable relative to the projection optical system, the second stage having a second overhang portion on one side;
a liquid immersion system that surrounds the final optical element of the projection optical system and that forms a liquid immersion region of a liquid under the final optical element of projection optical system; and
a controller that controls movement of the first and second stages to cause the liquid immersion region to be moved from an upper surface of one of the first and second overhang portions to an upper surface of the other of the first and second overhang portions in a state in which the first overhang portion and the second overhang portion are brought close to or in contact with each other such that the liquid of the liquid immersion region does not leak out from between the first and second stages, while the liquid remains in contact with a lower surface of the final optical element of the projection optical system.

9. The exposure apparatus of claim 8, wherein an area of the liquid immersion region is smaller than an area of the substrate.

10. The exposure apparatus of claim 8, wherein the second stage includes a second substrate holder that holds a substrate.

11. The exposure apparatus of claim 8, wherein an upper surface of the second stage includes measurement structures.

12. The exposure apparatus of claim 8, wherein the upper surface of the first overhang portion and the upper surface of the second overhang portion are in a same plane when the liquid immersion region is moved from the one of the upper surfaces to the other of the upper surfaces.

13. The exposure apparatus of claim 8, wherein the first overhang portion extends along only the one side of the first stage, and the second overhang portion extends along only the one side of the second stage.

14. The exposure apparatus of claim 8, wherein the liquid immersion system includes a plurality of the liquid supply ports and a plurality of the liquid recovery ports.

15. A device manufacturing method comprising:
exposing a substrate to a pattern using the immersion exposure apparatus of claim 8; and
developing the exposed substrate.

16. An immersion exposure method comprising:
forming a liquid immersion region of a liquid under a projection optical system, the liquid immersion region being formed between the projection optical system and an upper surface of one of a first stage and a second stage; and
moving the liquid immersion region from the upper surface of the one of the first and second stages to an upper surface of the other of the first and second stages, the moving taking place while the first and second stages are in a state in which a first overhang portion provided at the first stage and a second overhang portion provided at the second stage are brought close to or in contact with each other, such that the liquid of the liquid immersion region does not leak out from between the first and second stages while the liquid immersion region is moved from one of upper surfaces of the first and second overhang portions to the other of the upper surfaces of the first and second overhang portions while liquid is present in the liquid immersion region.

17. The method of claim 16, wherein the liquid of the liquid immersion region remains in contact with a lower surface of a final optical element of the projection optical system during the moving.

18. The method of claim 16, wherein an area of the liquid immersion region is smaller than an area of a substrate held on one of the first and second stages.

19. The method of claim 16, wherein the first stage includes a substrate holder that holds a substrate.

20. The method of claim 19, wherein the second stage includes a substrate holder that holds a substrate.

21. The method of claim 16, wherein the upper surface of the first overhang portion and the upper surface of the second overhang portion are in a same plane when the liquid immersion region is moved from the one of the upper surfaces to the other of the upper surfaces.

22. The method of claim 16, wherein the first overhang portion extends along only one side of the first stage, and the second overhang portion extends along only one side of the second stage.

23. The method of claim 16, wherein the liquid immersion region is formed by a liquid immersion system that surrounds a final optical element of the projection optical system and includes a liquid supply port by which the liquid is supplied to the liquid immersion region, and a liquid recovery port by which the liquid is recovered from the liquid immersion region.

24. The exposure apparatus of claim 1,
wherein the first stage is capable of holding a substrate, and the upper surface of the first overhang portion and a surface of the substrate held by the first stage are substantially in a same plane.

25. The exposure apparatus of claim 24,
wherein the upper surface of the first overhang portion and the surface of the substrate are substantially in a same plane, when the liquid immersion region is moved from the one of the upper surfaces to the other of the upper surfaces.

26. The exposure apparatus of claim 1,
wherein the upper surface of the first overhang portion and an upper surface of the first stage are substantially in a same plane, the upper surface of the first stage surrounding a substrate held by the first stage.

27. The exposure apparatus of claim 26,
wherein the upper surface of the first overhang portion and the upper surface of the first stage are substantially in a same plane, when the liquid immersion region is moved from the one of the upper surfaces to the other of the upper surfaces.

28. The exposure apparatus of claim 1,
wherein the first stage and the second stage move in the same direction when the liquid immersion region is moved from the one of the upper surfaces to the other of the upper surfaces.

29. The exposure apparatus of claim 1,
wherein the first overhang portion protrudes in a direction which is perpendicular to an optical axis of the projection optical system.

30. The exposure apparatus of claim 8,
wherein the upper surface of the first overhang portion and the surface of the substrate held by the first stage are substantially in the same plane.

31. The exposure apparatus of claim 30,
wherein the upper surface of the first overhang portion and the surface of the substrate held by the first stage are substantially in the same plane when the liquid immersion region is moved from the one of the upper surfaces to the other of the upper surfaces.

32. The exposure apparatus of claim 8,
wherein the upper surface of the first overhang portion and an upper surface of the first stage which surrounds the substrate are substantially in a same plane.

33. The exposure apparatus of claim 32,
wherein the upper surface of the first overhang portion and the upper surface of the first stage which surrounds the substrate are substantially in a same plane when the liquid immersion region is moved from the one of the upper surfaces to the other of the upper surfaces.

34. The exposure apparatus of claim 8,
wherein the first stage and the second stage move in the same direction when the liquid immersion region is moved from the one of the upper surfaces to the other of the upper surfaces.

35. The exposure apparatus of claim 8,
wherein the first overhang portion protrudes in a direction which is perpendicular to an optical axis of the projection optical system.

36. The method of claim 16,
wherein the first stage is capable of holding a substrate and the upper surface of the first overhang portion and a surface of the substrate held by the first stage are substantially in a same plane, when the liquid immersion region is moved from the one of the upper surfaces to the other of the upper surfaces.

37. The method of claim 16,
wherein the upper surface of the first overhang portion and an upper surface of the first stage are substantially in a same plane when the liquid immersion region is moved from the one of the upper surfaces to the other of the upper surfaces, the upper surface of the first stage surrounding the substrate held by the first stage.

38. The method of claim 16,
wherein the first stage and the second stage move together in the same direction when the liquid immersion region is moved from the one of the upper surfaces to the other of the upper surfaces.

39. The method of claim 16,
wherein the first overhang portion protrudes in a direction which is perpendicular to an optical axis of the projection optical system.

* * * * *